United States Patent [19]

Argyle et al.

[11] 4,178,636
[45] Dec. 11, 1979

[54] GRADIENTLESS PROPULSION OF MAGNETIC BUBBLE DOMAINS

[75] Inventors: Bernell E. Argyle, Putnam Valley; John C. Slonczewski, Katonah; Pieter Dekker, Ossining, all of N.Y.

[73] Assignee: International Business Machines Corporation, Armonk, N.Y.

[21] Appl. No.: 877,928

[22] Filed: Feb. 15, 1978

Related U.S. Application Data

[63] Continuation of Ser. No. 659,880, Feb. 20, 1976, abandoned.

[51] Int. Cl.$^2$ ............................................. G11C 19/08
[52] U.S. Cl. ......................................... 365/30; 365/3; 365/25; 365/28
[58] Field of Search ........................ 365/3, 25, 28, 30

[56] References Cited

U.S. PATENT DOCUMENTS

| 4,052,710 | 10/1977 | Calhoun et al. ........................ 365/3 |
| 4,068,220 | 1/1978 | Argyle et al. ........................... 365/30 |

OTHER PUBLICATIONS

IEEE Transactions on Magnetics, vol. Mag. 11, No. 5, Sep. 1975 pp. 1091-1093.
IEEE Transactions on Magnetics, vol. Mag. 9, No. 4., Dec. 1973 pp. 617-621.
Journal of Magnetism & Magnetic Materials, vol. 2, 1976 pp. 357-360.

Primary Examiner—James W. Moffitt
Attorney, Agent, or Firm—Jackson E. Stanland

[57] ABSTRACT

Magnetic bubble domains are propagated in a magnetic medium in a desired direction using magnetic fields which have no spatial gradients. This is in contrast with conventional propagation techniques where magnetic overlays have to be used with applied magnetic fields in order to move domains. Depending upon the wall magnetization configurations in the domains, these domains are propagated by using, for example, a combination of a steady magnetic field and a magnetic field which varies with time, such as a pulse field or a sinusoidal field. This type of propagation is termed automotion. Bubbles which can automote are generated and detected in the magnetic medium using the principles of automotion. Embodiments are shown for representation of information using different types of bubbles, and in particular it is shown how to discriminate among bubble domains having wall configurations having a common winding number s. In a particular embodiment, a modulated bias field is superimposed on a steady magnetic field in the plane of the magnetic medium. Depending upon the direction of the in-plane magnetic field and upon the wall magnetization configuration of the bubbles, the bubbles can be made to move in different directions regardless of the directions of the modulated bias field.

39 Claims, 30 Drawing Figures

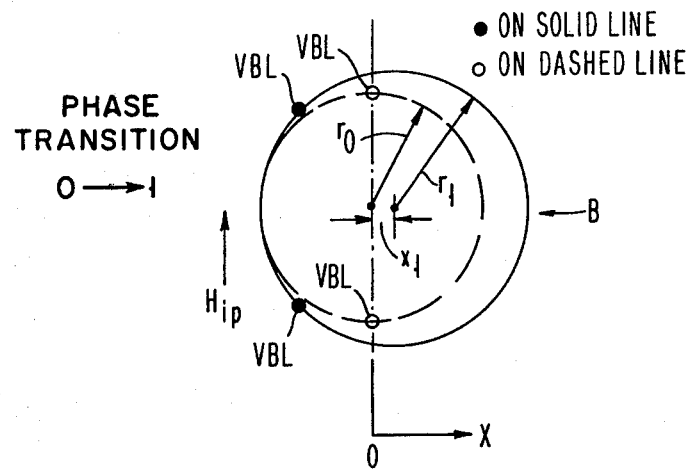
FIG. 10A  PHASE TRANSITION 0 → 1
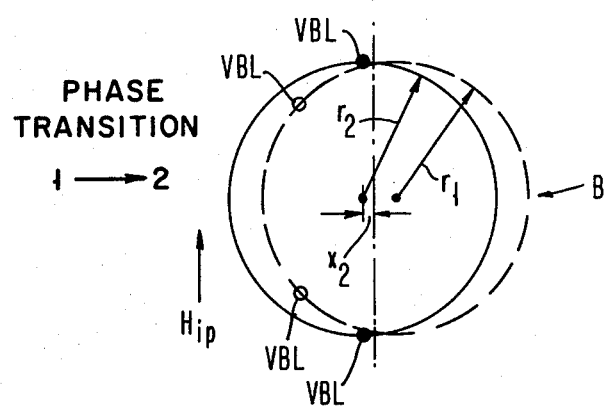
FIG. 10B  PHASE TRANSITION 1 → 2
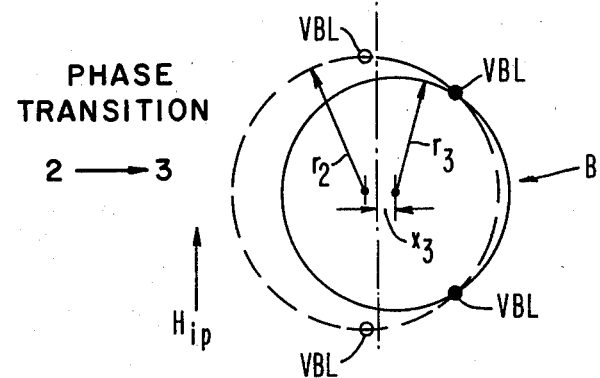
FIG. 10C  PHASE TRANSITION 2 → 3
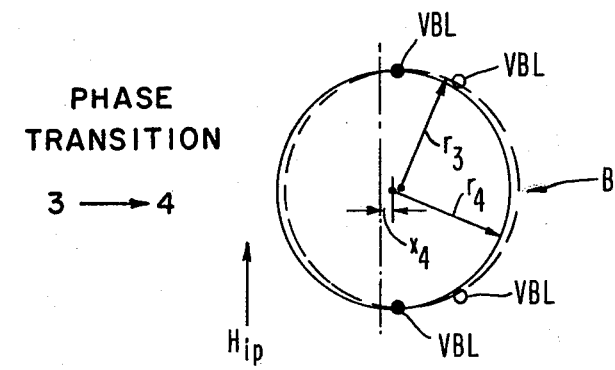
FIG. 10D  PHASE TRANSITION 3 → 4

GRADIENTLESS PROPULSION OF MAGNETIC BUBBLE DOMAINS

This is a continuation of application Ser. No. 659,880 filed 02/20/76 now abandoned.

BACKGROUND OF THE INVENTION

1. Field of the Invention

This invention relates to techniques for utilizing magnetic bubble domains, and more particularly to novel techniques for moving these bubble domains without requiring magnetic fields having spatial gradients. 2. Description of the Prior Art In the bubble domain art, many techniques are known for moving magnetic bubble domains. These techniques generally require the presence of active overlays, such as conductor overlays and magnetic element overlays. Conductor propagation occurs because currents in conductors provide localized magnetic field gradients which move the bubble domains.

Another type of bubble movement is the type known as "field access" propagation. These field access propagation techniques generally utilize a magnetic field in the plane of the magnetic medium, together with a magnetic overlay. The magnetic field interacts with the overlay to produce traveling localized magnetic fields so that spactial gradients exist along the direction the magnetic domains are to travel. For instance, a magnetic field in the plane of the magnetic medium can be used in combination with permalloy overlay patterns, which can have many shapes. Among these, the T-I bars, Y-I bars, and curved elements are well known.

Another field access technique for moving domains utilizes ion implanted regions in a magnetic material. Again, the in-plane magnetic field interacts with the ion implanted areas of the magnetic material to produce localized magnetic poles or charged walls for movement of the domains.

Still another type of bubble domain motion uses modulations of the bias field in combination with wedge shaped patterns of magnetic material. The bubble domain is made to expand and contract and will thereby be moved along from one triangular wedge to the next due to the asymmetry of wall motion produced by the triangular wedges. If the triangular wedges are not present, continuous bubble movement in a desired direction cannot be obtained.

In all but the last of these propagation schemes, spatial gradients in the magnetic field are used to provide forces for movement of bubble domains in the magnetic medium. In contrast with this, the present invention seeks to utilize magnetic fields which are spatially uniform. Further, the present invention seeks to move magnetic bubble domains without requiring over- or under-layers of the types previously described. That is, there is no need for "active" propagation elements which, in combination with applied magnetic fields, will move domains. By the term "active" a distinction is made with regard to "passive" overlays which can be used, for instance, merely as guiding structures for the bubble domains. Such guiding structures are not necessary for providing the forces for actual movement of the domains, but rather only channel their direction of movement. Thus, the present invention is characteized by movement of magnetic bubble domains using magnetic fields which have no spatial gradients and wherein no active overlays are required for bubble movement.

In the present invention, time varying magnetic fields are applied to the bubble domains in order to change (precess) their wall magnetization vector distribution which in turn provides a reaction force to move domains in a desired direction. In order that continual application of the time varying field will move the domains, the original state of wall magnetization vectors tends to be restored prior to each application of the time varying magnetic field. Thus, bubble motion occurs by altering wall magnetization distribution, restoring this distribution, and again altering the distribution, etc.

The present invention is distinguished from that shown in U.S. Pat. No. 3,876,994 where an in-plane field is used to affect the mobility of the magnetic bubble material. In that patent, conventional propagation structures are used to move the domains, and no reference is made to the principle of operation of the present invention. At the very minimum, propagation in accordance with that patent requires active propagation elements.

Since uniform magnetic fields are used in the present invention, the structures which provide these fields can be removed from close proximity to the magnetic bubble domain chip. This means that there is less disturbance to the magnetic chip and that the overall structure is easier to fabricate and consumes less heating on-chip. Of course, this eases packaging requirements.

Another advantage of the present invention is that no active overlays are required and hence the density of devices using the principles described herein are not lithography limited. By merely changing the direction of the magnetic field used for restoration of wall magnetization distribution, the domains can be made to move in different directions. Additionally, the magnitudes of the magnetic fields used to alter wall magnetization distribution can also be readily changed for propagation of different types of bubble domains.

Another advantage is that bubble domains having the same winding numbers can be discriminated using the practices of this invention. previously, such domains could not be discriminated from one another since they will deflect along the same angle in a spatial gradient magnetic field. The ability to discriminate bubbles in this manner means that additional techniques for coding information are provided.

Another advantage of the present invention is that the automotion effect described herein produces a large effect. Optimally, velocities in the range $10^2$–$10^3$ cm./sec. are possible. If desired, the applied magnetic fields used for movement of the domain can be spatially uniform fields which are sinusoidal, preferably at or close to a natural resonance frequency of the domain (typically 1–$10^2$ MHz). In this case, the amplitude of the time varying field need only be somewhat greater than the coercive field in order to produce the maximum domain velocity. Thus, an efficient mechanism for domain movement is provided.

Accordingly, it is a primary object of the present invention to provide a new technique for movement of magnetic bubble domains.

It is another object of the present invention to provide a technique for moving magnetic bubble domains which does not utilize magnetic fields having spatial gradients.

It is still another object of the present invention to efficiently move magnetic bubble domains without requiring active overlay structures.

It is a further object of the present invention to utilize magnetic fields without spatial gradients for the movement of magnetic bubble domains at high velocities.

A still further object of the present invention is to provide magnetic bubble domain propagation by a technique which is not lithography-limited.

A further object of the present invention is to provide systems utilizing magnetic bubble domains for information storage, whose density is not limited by lithography.

Another object of the present invention is to provide improved techniques for discriminating magnetic bubble domains which have the same or different winding numbers.

Still another object of the present invention is to provide a technique for generation, propagation, and detection of magnetic bubble domains using magnetic fields having no spatial gradients.

Still another object of the present invention is to provide magnetic bubble domain manipulation using magnetic fields which are easily provided and in which the packaging of device structures is facilitated.

A further object of the present invention is to provide a technique for moving magnetic bubble domains using spatially uniform, time varying magnetic fields whose amplitudes are not excessively large.

BRIEF SUMMARY OF THE INVENTION

Magnetic bubble domains are continuously propagated in a magnetic medium using, for example, a combination of a time varying magnetic field and a steady magnetic field. No structural overlays are required for movement of bubble domains using these magnetic fields.

In particular, the invention requires magnetic bubble domains having certain types of wall magnetization configurations in order that propagation by gradientless magnetic fields, called "automation", is achieved. When the time varying magnetic field is applied, magnetization vectors localized within the wall of the domain precess, which in turn causes a displacement of the domain center. A steady magnetic field is typically used to restore the magnetization vector distribution to its original form with respect to the center of the domain, so that automotion can occur again when the time varying magnetic field changes. Thus, a force is present to restore the initial state of the magnetic domains so that each new time varying magnetic field will move the bubble domains. The direction of motion of the bubble domains depends upon the steady magnetic field and on the particular wall configuration. It should be noted that the restoring force provided by the steady magnetic field can also be inherent due to crystallographic misalignment in the bubble domain material. The important feature is that a force is present which tends to restore the original magnetization configuration of the bubble wall so that the time varying magnetic field will move the bubble domain continuously in the magnetic medium.

The wall magnetization configuration required for bubble domain automation is that which will move when pulsed magnetic fields are applied. For example, two clusters of Bloch lines on opposite sides of a magnetic bubble domain wall will undergo movement along the wall periphery when a time varying magnetic field is applied along the direction of the bias field to stabilize the size of the domains. Due to the movement of these Bloch lines, a reaction force will be created to displace the bubble domain. In an in-plane magnetic field is also present, this will tend to restore the Bloch line clusters to their original locations after they have been moved by the time varying magnetic field. Thus, when the next time varying magnetic field pulse (or cycle) occurs, the Bloch lines will move again and create another force tending to move the bubble domains in the same direction. In this example, the in-plane magnetic field direction and the particular Bloch line configuration of the bubble domains determines the direction of movement of the domains. Thus, the steady, in-plane magnetic field determines the bubble domain direction of movement, and in addition provides forces for restoring the magnetic domain wall magnetization to its original state so that continual displacement can occur as the bias field is time modulated.

In the example stated, the movement of the Bloch lines in the bubble domain wall to their original polar (azimuthal) positions during the restoration of the wall magnetization state provides a force which would tend to move the bubble domains in a reverse direction. However, due to non-linearities such as coercivity, the bubble domains are prevented from returning to their original positions.

Embodiments are shown for storing magnetic bubble domains using the principles of automotion, as well as for generation and detection of the domains, also using automotion. In particular, a lattice of such domains can be utilized in an information handling system.

These and other objects, features, and advantages will be more apparent from the following more particular description of the preferred embodiments.

BRIEF DESCRIPTION OF THE DRAWINGS

FIG. 2A is a top view of the bubble domain of FIG. 2B, taken along the mid-plane of the bubble of FIG. 2B.

FIGS. 4A shows a $\sigma_+$ bubble while FIG. 4B show a $\sigma_-$ bubble. FIG. 5A shows a $\phi_1$ bubble while FIG. 5B shows a $\phi_2$ bubble. FIG. 6A shows a $\pi_+$ bubble while FIG. 6B shows a $\pi_-$ bubble. The notations $\sigma$, $\phi$, and $\pi$ have been arbitrarily utilized to designate these bubbles.

FIG. 7A illustrates the positive sense of the angle $\theta$ through which the vertical Bloch line moves, the distance y, the bubble domain radius r, and the bubble domain displacement x. FIG. 7B illustrates the gyrotropic forces $F_g$ acting on the vertical Bloch lines due to their motion, and the reaction force F which displaces the bubble domain.

FIGS. 10A-10D illustrate the changes which occur in bubble domain radius, wall magnetization configuration, and displacement during bubble automotion through successive phases 0, 1, 2, 3, and 4, using the waveforms of FIG. 9.

FIG. 11A illustrates automotion for varying magnitudes of in-plane field $H_{ip}$, where the pulse modulated bias field $h_z(t)$ has an amplitude $h_a$ and a pulse width $\tau$ which are fixed. FIG. 11B illustrates displacement per pulse during automotion as a function of $h_a$, for a fixed magnitude of in-plane field $H_{ip}$ and a fixed pulse width $\tau$. FIG. 11C illustrates the displacement per pulse during automotion as a function of the width $\tau$ of the field $h_z(t)$ where the amplitude $h_a$ and the amplitude of $H_{ip}$ are held constant.

DETAILED DESCRIPTION OF THE PREFERRED EMBODIMENTS

Introduction

Bubble domain movement through automotion utilizes the direct effect of magnetic fields on the wall magnetization configuration of bubbles. In general, it is not necessary to use magnetic fields having spatial gradients, as has been utilized previously for continuous movement of bubble domains in practical devices. Instead, spatially uniform time varying pulse or sinusoidal fields, for example, are utilized to provide transient or oscillatory torques acting on the wall moments of the bubbles in order to oscillate them and consequently cause oscillation of the bubble domain. A restoring force is provided to restore the initial configuration of wall magnetization in the domains so that the time varying magnetic field will continually exert forces for movement of bubbles in a desired direction. Depending upon the waveform of the time varying magnetic field and the wall configuration, automotion can be achieved with many different types of bubble domains.

In order that this bubble domain oscillation give rise to steady average motion in a desired direction a non-linearity, such as wall coercivity, is present. This non-linearity in combination with asymmetry of domain structure insures that bubble domain motion in the opposite direction during restoration of the wall magnetization following an applied time varying field is not sufficient to return the bubble to its original position (i.e., its position before the field was applied). In a particular example chosen for illustrative purposes only, a modulated bias field together with a steady magnetic field in the plane of the magnetic medium is used to automote bubbles. Each variation of the bias field causes Larmor precession of the wall moments of the bubble domain, and the precession of these wall moments causes a reaction force which moves the bubble domain. The in-plane magnetic field restores the positions of the wall moments so that continuing motion of the bubble domain will occur as subsequent bias field variations are applied to the bubble. The direction of movement of the bubble is determined by the direction of the in-plane field and by the particular wall configuration of the bubble. For the bubble states thus far studied in the laboratory, the direction of the modulated bias field does not affect the direction of bubble domain motion for $\sigma$, $\pi$, and $\phi$ bubbles. However, unichiral bubbles (having no vertical Bloch lines) move in directions which depend on the sense of the modulated bias field, for a fixed pulse shape. The modulated bias field can be a pulse field or a sinusoidal field, for example, and the in-plane magnetic field can be eliminated if the bubble domain material has a crystallographic structure that provides inherent restoring forces on the wall moments of the bubble, tending to restore these wall moments to their original positions in the absence of the time modulated bias field.

FIGS. 1, 2A, 2B and 3

Figure 1:
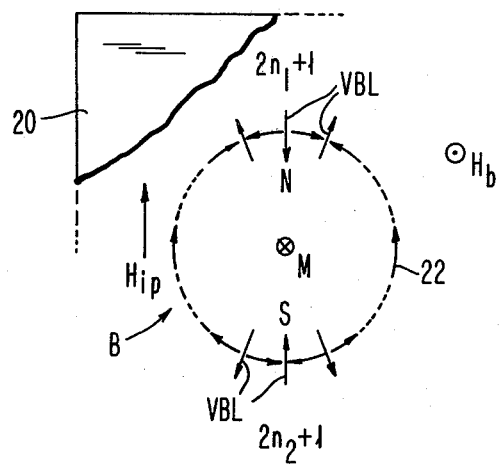
FIG. 1 is a schematic illustration of a bubble domain with a generalized wall magnetization state that can be moved by automotion.
Figure 2A:
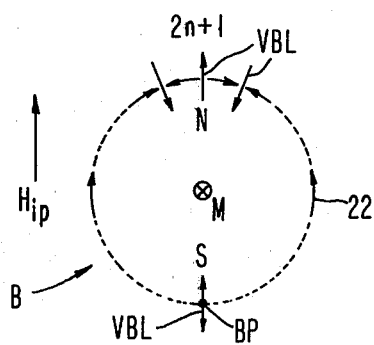
FIGS. 2A and 2B illustrate another bubble domain which can be moved by automotion, where
Figure 2B:
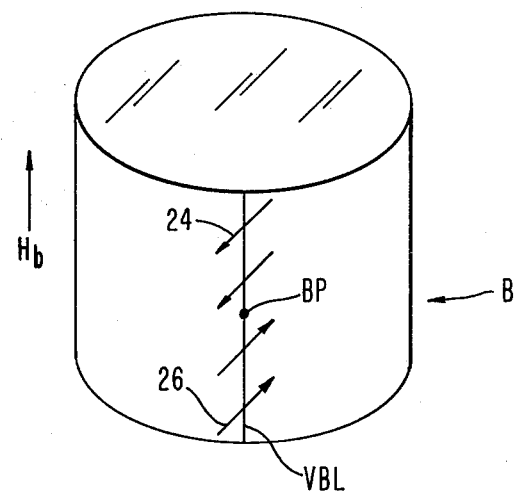
Figure 3:
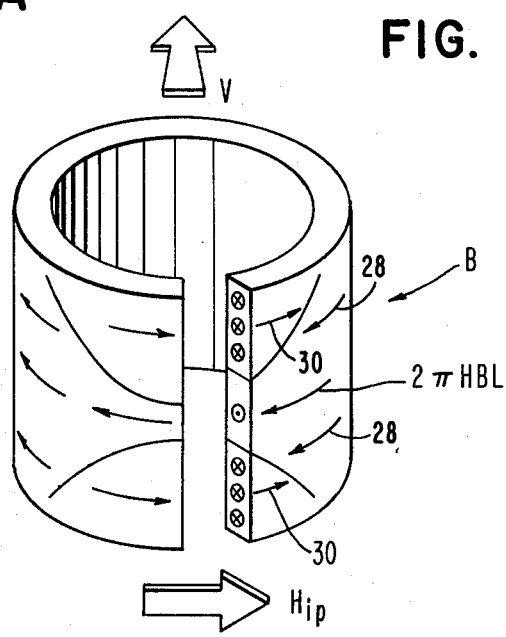
FIG. 3 illustrates another magnetic bubble domain which can be moved by automotion, where this bubble is characterized by a $2\pi$ horizontal Bloch line HBL.

FIGS. 1, 2A, 2B and 3 illustrates the wall magnetization configurations of bubble domain which are exemplary of those which can be moved by bubble domain automotion in accordance with the principles of this invention. In particular, FIG. 1 and FIGS. 2A, 2B illustrate bubble domains having vertical Bloch lines VBL's in their wall structure while FIG. 3 illustrates a bubble domain having a $2\pi$ horizontal Bloch line HBL in its wall structure.

In FIG. 1, a bubble domain material 20 has a bubble domain B therein which has a wall magnetization configuration generally illustrated by the direction of arrows 22. Arrows 22 are directed along the periphery of domain B, except within the vertical Bloch lines VBL where they are directed radially, as is well known in the art. In this regard, reference is made to U.S. Pat. No. 3,890,605 which illustrates magnetic domain systems using bubble domains having differing numbers of vertical Bloch lines.

Figure 1A:
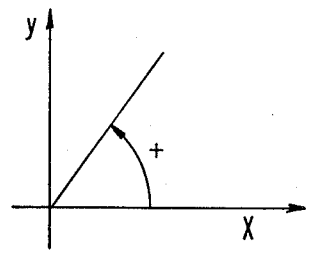
FIG. 1A indicates the positive sense of winding of wall magnetization of the bubble domains indicated by FIG. 1, as well as for the bubble domains shown in succeeding figures, where the sense of winding s refers to the direction of twist of magnetization vectors within the domain wall as the wall periphery is traversed.

Domain B has two clusters of vertical Bloch lines, the upper cluster containing $(2n_1+1)$ negative BL's while the lower cluster contains $(2n_2+1)$ positive BL's. The notation $(-,+)$ indicates the sense of the local VBL winding on traversing the wall periphery, in accordance with the convention shown in FIG. 1A. Hence, the sense of winding for the top cluster of VBL's is negative while that for the bottom cluster of VBL's is positive.

In FIG. 1, $n_1$ and $n_2$ are integers having values 0, 1, 2,... so that there will be an odd number of Bloch lines in each cluster. If $n_1 = n_2$, the number of VBL's in each cluster will be the same.

The field $H_{ip}$ is in the plane of magnetic medium 20 and prevents the Bloch lines from approaching each other and unwinding to annihilate one another. That is, this field provides a restoring force tending to provide separate clusters of VBL's in the wall of domain B. The upper cluster constitutes overall a north magnetic pole N and the lower cluster constitutes overall a south magnetic pole S.

FIG. 2A illustrates a domain B which is similar to that of FIG. 1, except that the lower cluster of VBL's contains a single VBL having a Bloch point (BP) therein. As is known in the art, this is a vertical Bloch line having a singularity along its length. This is illustrated more clearly by FIG. 2B, where the vertical Bloch line has a Bloch point along its length separating regions having wall moments oppositely directed as indicated by arrows 24 and 26. The top cluster of VBL's contains $(2n+1)$ VBL's as indicated.

Another bubble domain which will move when time varying magnetic fields are applied to it is the bubble domain illustrated in FIG. 3. This domain B is characterized by a $2\pi$ horizontal Bloch line HBL separating regions of the domain wall having oppositely directed wall moments, as illustrated by arrows 28 and 30. When an asymmetric z field pulse and a strong in-plane field $H_{ip}$ are applied, the bubble will move in the direction indicated by arrow V.

The asymmetric field pulse is one which has a different rise and fall time. For instance, a pulse with a rise time of 300 nanoseconds and a fall time of 20 nanoseconds and width approximately 0.5 microseconds has been used to automote unichiral bubbles in a garnet sample. The in-plane field was 30 Oe and the magnitude of the z field pulse was $h_a = 6$ Oe. The steady bias field $H_b$ was 48 Oe. Application of these fields to the unichiral domain generated a $2\pi$ horizontal Bloch line as indicated in FIG. 3. This horizontal Bloch line appears in a transient condition.

The automotion observed in the laboratory was ascribed to the difference in dynamic behavior between a "loaded" heavy part of the bubble wall where the magnetization of the wall is anti-parallel to $H_{ip}$ and the normal part of the wall where the magnetization of the wall is parallel to $H_{ip}$. Upon a fast step in the bias field pulse $h_z(t)$, the heavy part cannot immediately respond. Since this part does not immediately respond the net velocity of the bubble center is approximately $\vec{V}/2$ where $\vec{V}$ is the velocity of the normal wall. $\vec{V}$ is normal to the field $H_{ip}$.

When the bias field step is caused by a slow variation with respect to time, both wall parts respond by equal but opposite displacements and the bubble center does not move. Reversal of the polarity of the z field pulses changes the signature of velocity of the center of the bubble. This is in contrast with the Bloch line bubbles previously described where a change in the polarity of the z field pulse has no effect on the automation displacement direction of the bubble for a fixed direction of $H_{ip}$. For the present case, the velocity at the center of the bubble $\vec{V}_{ctr} = c^{|h|}(z \times \vec{H}_{ip})/h_a H_b$.

FIGS. 4–6

Figure 4A:
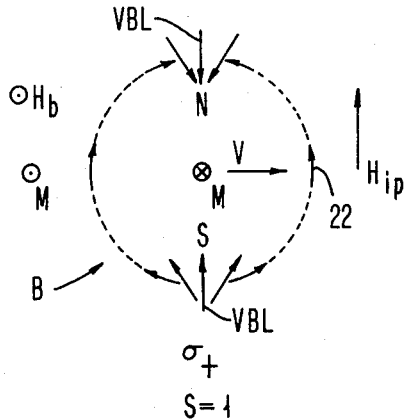
FIGS. 4A, 4B, 5A, 5B, and 6A, 6B illustrate wall magnetizations for bubble domains which can be moved by automotion. In particular.
Figure 4B:
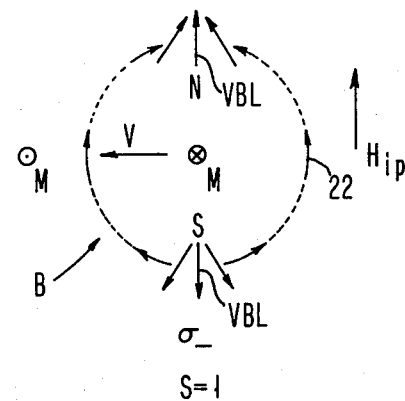

These figures illustrate specific examples of bubble domains which can be automated using time varying bias fields in combination with an in-plane magnetic field $H_{ip}$. FIGS. 4A and 4B illustrate two kinds of bubble domains having the same winding numbers $s = 1$. This winding number, or revolution number, is the number of rotations the wall moment makes going around the periphery of the domain wall. It is described in more detail in aforementioned U.S. Pat. No. 3,890,605, and in an article by J. C. Slonczewski et al which appeared in the AIP Conference Proceedings 10, p. 458 (1973). In all of these figures, the magnetization M of the bubble is into the paper while the magnetization M outside the bubble is directed out of the paper. As will be seen later, $\sigma_+$ and $\sigma_+'$ bubbles automate in opposite directions and are therefore distinguishable using automotion principles.

Figure 5A:
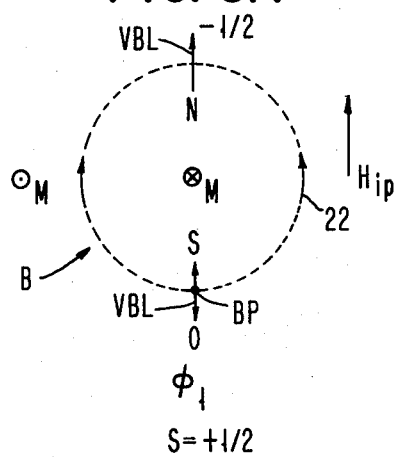
Figure 5B:
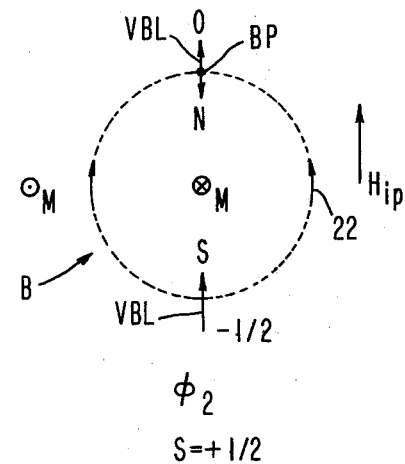

FIGS. 5A and 5B show the wall magnetization states of bubble domains indicated as $\phi_1$ and $\phi_2$. Both $\phi_1$ and 100 2 bubble domains contain one vertical Bloch line with local winding number $-\frac{1}{2}$, and a vertical Bloch line having a Bloch point therein. $\phi$ state bubble domains automote along directions at an angle of about 45° with the in-plane field, or about 135° with this field.

Figure 6A:
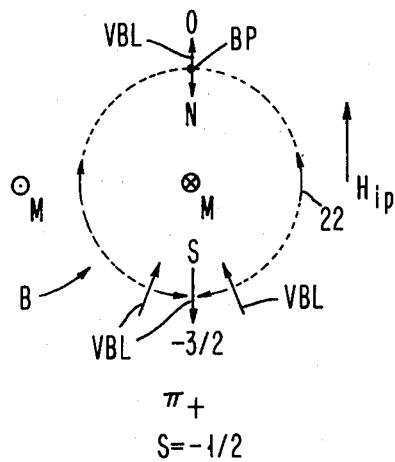
Figure 6B:
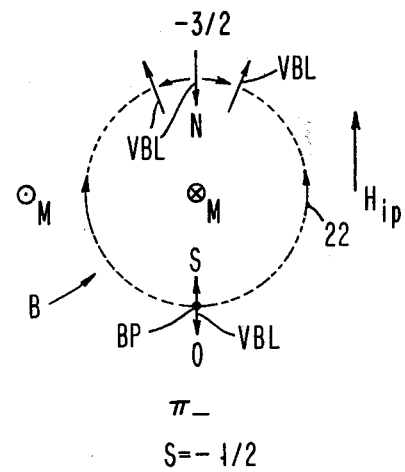

FIGS. 6A and 6B show two $\pi$-state bubble domains, designated $\pi_+$ and $\pi_-$. The $\pi$-state bubbles have winding numbers $s = -\frac{1}{2}$. A $\pi_+$ domain and a $\pi_-$ domain will automate along the plus and minus y directions, respectively.

In FIG. 6A the $\pi_+$ domain has a winding number $s = -\frac{1}{2}$, and is characterized by a single vertical Bloch line having a Bloch point BP (local winding number zero) and an opposite cluster of VBL's which has a local winding number of $-3/2$.

The $\pi_-$ bubble of FIG. 6B also contains a single vertical Bloch line with a Bloch point therein (local winding number zero) and three vertical Bloch lines having local winding number $-3/2$.

FIGS. 7A, 7B and 8A–8C

Figure 7A:
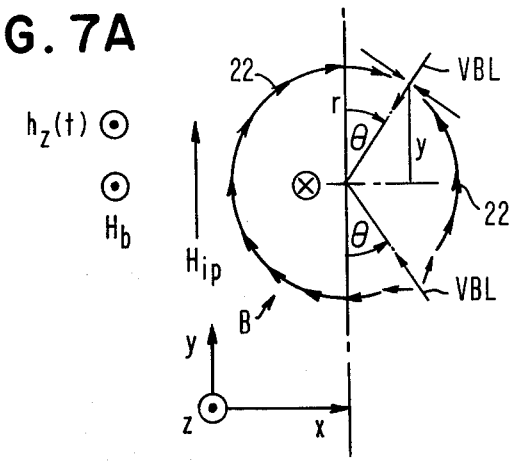
FIGS. 7A and 7B illustrate the variables used to describe bubble domain motion due to automation for a bubble domain having vertical Bloch line (VBL) clusters in its wall structure. In particular.

These figures illustrate the forces acting on the wall moments during automotion and the directions of motion of the bubble domains. In particular, FIG. 7A illustrates the displacement of vertical Bloch lines along the periphery of the bubble domain wall from an initial position along the Y axis to the positions shown. These vertical Bloch lines have precessed through an angle $\theta$ and the radius of the bubble is now r. The bubble domain center has moved a distance x to the right of its initial position. This figure shows the positive directions of x, y, and z, as well as the positive sense of the angle $\theta$.

Figure 7B:
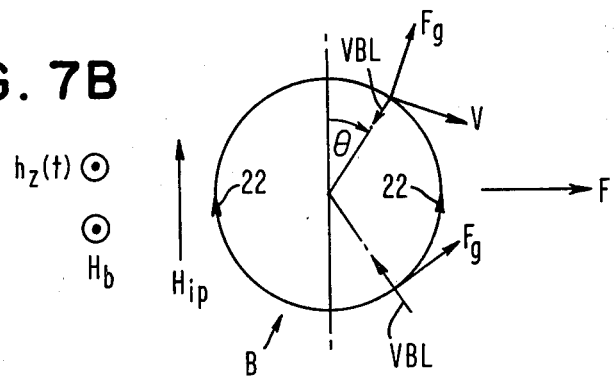

FIG. 7B illustrates the forces acting on the vertical Bloch lines during automotion caused by the modulated bias field $h_z(t)$ and an in-plane force $H_{ip}$ in the direction indicated. A gyrotropic force $F_g$ acts on the vertical Bloch lines normal to the direction of velocity V of the Bloch lines and a reaction force F displaces the bubble domain to the right.

Figure 8A:
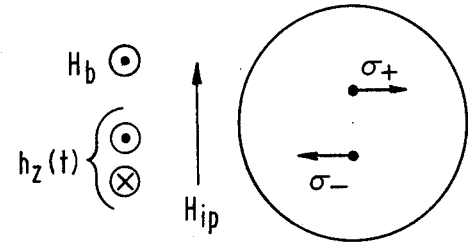
FIG. 8A illustrates the velocity signatures of $\sigma_+$ and $\sigma_-$ bubbles when automoted by applied magnetic fields $H_{ip}$ and $h_z(t)$, in the presenceof a steady bias field $H_b$.
Figure 8B:
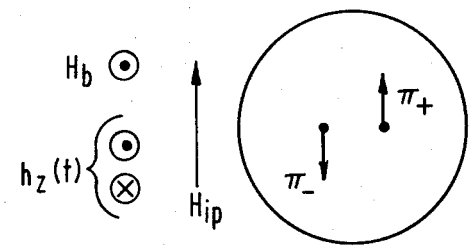
FIG. 8B illustrates the direction of movement due to automotion of $\pi_+$ and $\pi_-$ bubble domains when the magnetic fields $H_b$, $H_{ip}$ and $h_z(t)$ are applied.
Figure 8C:
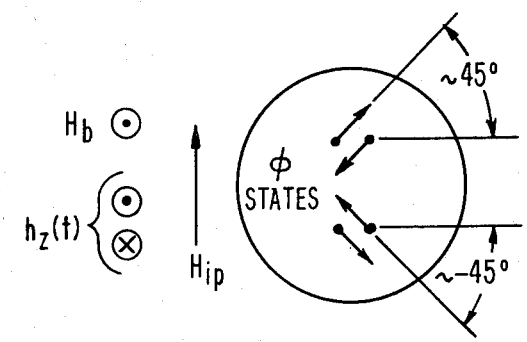
FIG. 8C indicates the velocity directions of $\phi$ state bubbles when automoted by the magnetic fields $H_b$, $H_{ip}$ and $h_z(t)$.

FIGS. 8A–8C illustrate the velocity signatures (directions of movement) of $\sigma$ bubbles, $\pi$ bubbles, and $\phi$ bubbles during application of a modulated bias field $H_z = H_b + h_z(t)$ and an in-plane field $H_{ip}$ in the directions indicated. The $\sigma_+$ bubble will move to the right while the $\sigma$ bubble will move to the left, thus discriminating thest two bubbles. The $\pi_+$ bubble will move upwardly while the $\pi$ bubble will move downwardly. The $\phi$ state of bubbles move along directions which are about $+45°$ and $-45°$ with respect to the horizontal axis.

Theory of Automotion

The bubble domain automotion to be described quantitatively here is that of a representative bubble, such as a $\sigma$ state bubble. The notations used are those which have been illustrated.

A static bias field with normal component $H_z = H_b(>0)$ and a smaller in-plane component $H_y = -H_{ip}(>0)$ are applied. The magnetization $\vec{M}(\vec{x})$ (of constant magnitude) is parallel to $H_b$ outside the domain and antiparallel inside the domain. Within the domain wall, $\vec{M}$ rotates continuously as a function of $\vec{x}$. Dipole-dipole interactions orient $\vec{M}_{xy}$, the projection of $\vec{M}$ onto the film plane, tangentially with respect to most of the circular boundary, as indicated by the arrows in FIGS. 4A and 4B. Vertical Bloch lines VBL, lying parallel to the z axis and having N and S magnetic polarities, separate wall regions of opposing $\vec{M}_{xy}$ orientation. The field $H_{ip}$ stabilizes their positions at the $\pm y$ extremities of the cylinder.

The winding or revolution number s is the number of rotations $\vec{M}_{xy}(\vec{x})$ makes when $\vec{x}$ circulates once around the domain. The states $\sigma_+$ and $\sigma_-$, shown in FIGS. 4A and 4B, satisfy s=1. Local winding numbers $\pm\frac{1}{2}$ and $\mp\frac{1}{2}$ are associated with N and S, respectively, for the states $\sigma_\pm$.

In the presence of pulse modulation $H_z = H_b + h_z(t)$, with amplitude $h_a$, the distribution $\vec{M}(\vec{x})$ varies with time t. Symmetry is assumed about the plane y=0, thus neglecting the deflection effect due to the condition $s \neq 0$. FIG. 7A shows the three dynamical variables: $\theta$, the angular position of the VBLs; r, the cylinder radius; and X the x-coordinate of the domain center.

Figure 9:
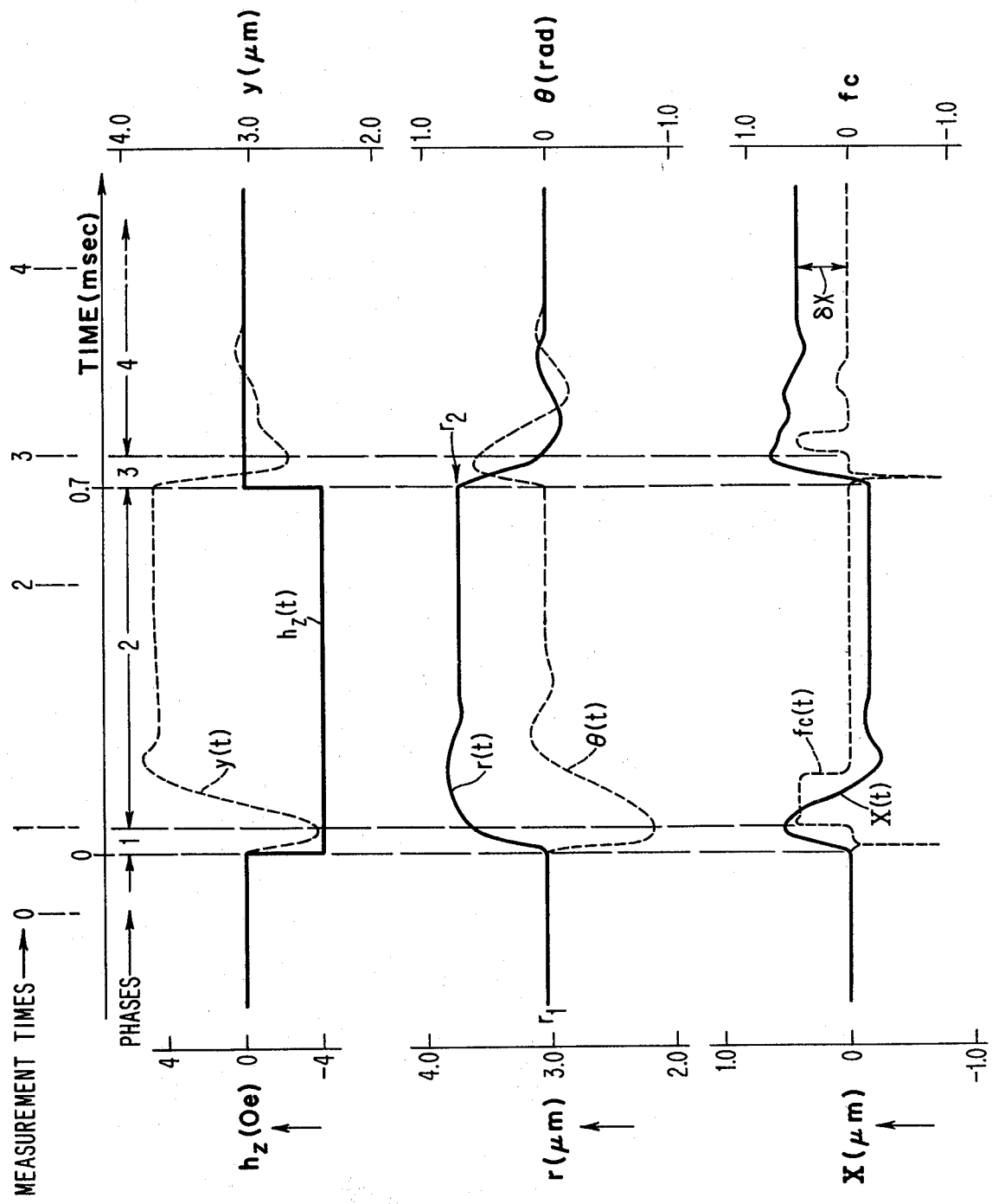
FIG. 9 shows a set of waveforms illustrating the applied magnetic field $h_z(t)$ used to automote bubble domains, r(t) being the change of radius of the bubble domain when automated, x(t) being the displacement of the bubble domain due to automotion, $\theta(t)$ being the rotation of vertical Bloch lines in the bubble domain wall structure, y(t) being the vertical displacement of the vertical Bloch lines during automotion, and $f_c(t)$ being a function which takes into account the coercivity of the bubble domain material during domain motion.

FIG. 9 shows typical results of the theory. The initial step of a single pulse (assumed negative as for most of the experiments) expands the bubble from $r=r_1$ toward a new equilibrium $r=r_2$. Meanwhile, each VBL responds with velocity $$\vec{V} = \pm(\gamma/2\pi M)\vec{1}_z X \vec{F}, \quad (\vec{1}_z = \text{unit vector}) \quad (1)$$

caused by the force per unit length $\vec{F}$ acting on it (see FIG. 7B). Since the sign of $\vec{V}$ depends on the sign of VBL winding, the bias step causes the VBLs to circulate in opposite sense around the domain. The y components of VBL velocity react, according to equation (1), against the wall with the total x-component force $-4\pi M\dot{y}/\gamma$, where $y = r \cos\theta$ and means d/dt. Viscous damping and coercivity of the bubble translation balance this force giving the relation $$\dot{X} = (4H_c\Delta\gamma/\pi\alpha)f_c(\dot{r}/\dot{X}) - (2\Delta\dot{y}/\alpha r). \quad (2)$$

Here $\alpha$ is the Gilbert damping coefficient, $\Delta(=\sqrt{A/K})$ is the wall-thickness parameter, $H_c(>0)$ is the coercivity and $$f_c(\dot{r}/\dot{X}) = -[1-(\dot{r}/\dot{X})^2]^{\frac{1}{2}}sgn\dot{X} \text{ or } 0 \quad (3)$$

for $|\dot{r}| <$ or $> |\dot{X}|$, respectively. This representation of coercivity agrees qualitatively with the experimental observation that radial oscillations decrease the threshold for ordinary gradient propagation.

During phase 1 of the motion (see FIG. 9), when $\dot{\theta}<0$ and $\dot{y}<0$ hold, equations (2) and (3) imply $\dot{X}>0$. During the early part of phase 2, $\theta$ relaxes (with oscillations) toward 0 because of the VBL restoring force provided by $H_{ip}$. The center meanwhile reacts to the now positive $\dot{y}$ with a generally negative $\dot{X}$. Similar events, though not simply sign changes, take place during the bubble contraction following the end of the pulse. The result at $t=\infty$ (for a single pulse) is a net displacement $$\delta X = \int_0^\infty \dot{X} dt$$

which represents automotion. Equations (2) and (3) show that $\delta X$ vanishes unless (1) $H_c$ is nonvanishing, or (2) the t-dependence of r in the generally large term $-2\Delta\dot{y}/\alpha r$ is taken into account in the course of integrating since $$\int_0^\infty \dot{y} dt = 0.$$

According to numerical results, effect (1) is by far the greater, so that to good approximation $$\delta X = (rH_c\Delta\gamma/\pi\alpha)\int_0^\infty f_c(\dot{r}/\dot{X})dt. \quad (4)$$

To explain $\delta X>0$ for $\sigma_{30}$ note, on the one hand, the conditions $\dot{y}<0$, $\dot{X}>0$ [see equations (2) and (3)] during phases 1 and 3 while the strong pressure due to $h_z$ is causing $|\dot{r}|$ to be large and $|f_c|$ therefore generally small. The opposite signs $\dot{y}>0$, $\dot{X}<0$, on the other hand, generally occur during phases 2 and 4 while the weak force due to $H_{ip}$ is restoring the VBLs to equilibrium. Now $|\dot{r}|$ is small and therefore $f_c$ is sometimes large (and positive) as indicated in the figure, yielding $\delta X>0$. Similarly, the $\sigma_-$ bubble automotes with $\delta X<0$, but the sign of $\delta X$ does not depend on the sign of $h_z$. Comparable automotions with the same signs occur for sinusoidal excitation. Thus, automotion is caused by the tendency of dynamic coercivity (or another nonlinearity) to preferentially retard one sign of domain-center oscillation because it occurs while the radius varies more slowly.

Examples of Automotion (FIGS. 9 and 10A–10D)

FIG. 9 shows the waveforms of the bubble domain displacement x(t), angular displacement $\theta(t)$ of the vertical Bloch lines during automotion, the bubble domain radius r(t) and, the distance y(t), of a bubble domain when automoted by a pulse modulation field $h_z(t)$ in combination with an in-plane magnetic field $H_{ip}$. FIGS. 10A–10D illustrate the motion of the bubble domain during automotion from one phase to the next for the phases 0–4, and also illustrate the changes in size of the domain and the positions of the vertical Bloch lines during automotion. In FIGS. 10A–10D, the initial position of the bubble domain is indicated by the dashed lines while the bubble domain at the next measurement time is indicated by the solid lines. Thus, in FIG. 10A, the dashed circle of radius $r_0$ is the bubble domain wall at measurement time zero while the solid line having a radius $r_1$ is the same bubble domain at the end of phase 1 as shown in FIG. 9. The vertical Bloch line locations at the starting point of each phase transition are indicated by hollow circles while the vertical Bloch lines at the next successive measurement time are indicated by the black circles. The displacement of the bubble domain during automotion is indicated by the distance x.

Referring to FIGS. 9 and 10A–10D, the behavior of the bubble domain B during automotion will be illustrated. From FIG. 9, at time 0, the bubble domain has the following characteristics:
$r_0 = 3$ microns
$\theta_0 = 0°$
$x_0 = 0$
At time 1, domain B has the characteristics:
$r_1 = 3.6$ microns
$x_1 = 0.5$ microns
$\theta_1 = -42.4°$
Thus, the bubble domain has moved to the right by a distance $x_1$ when the field $h_z(t)$ has gone from 0 to $-4$ Oe. This in turn causes the radius of the bubble domain to increase and the vertical Bloch lines of the domain (in this case a $\sigma_+$ domain) have circulated to the left through an angle 42.4°. As was mentioned, this movement of the wall vectors is due to a gyrotropic force and produces a reaction force to the right causing bubble domain displacement.

FIG. 10B shows the transition of the bubble from the end of phase 1 to the end of phase 2. At the end of phase 1, the quantities $r_1$, $\theta_1$, and $x_1$ are as already indicated. From the curves of FIG. 9, the bubble domain at measurement time 2 (within phase 2) has the following characteristics:
$x_2 = -0.2$ microns
$r_2 = 3.8$ microns
$\theta_2 = 0°$
Thus, it is apparent that the bubble domain diameter has increased somewhat (with oscillation due to the domain mass) and that the center of the domain at end of phase 2 has moved to the left of its original starting position at measurement time 0. This movement to the left results because the vertical Bloch lines are returning to their original separated positions due to the in-plane magnetic field $H_{ip}$.

In FIG. 10C, the bubble domain is shown at the end of phase 2 (dashed line) and at time 3 (end of phase 3). In going from phase 2 to phase 3, the magnitude of the field $h_z(t)$ has changed, causing the radius of the bubble to decrease. Also, the bubble domain at the end of phase 3 has moved to the right of its initial starting position at phase 0. Thus, the bubble domain at the end of phase 3, shown as the solid line, has the following characteristics:
$r_3 = 3.1$ microns
$x_3 = 0.62$ microns
$\theta_3 = +31.5°$ FIG. 10D shows the bubble domain at the end of phase 3 and then at measurement time 4 (within phase 4). From this drawing, it is apparent that the radius of the domain is approximately the same as at the end of phase 3, and that the vertical Bloch lines have returned to a position of maximum displacement from one another. Also, it is apparent that the displacement $x_4$ is a positive displacement, indicating that at the end of the pulse field $h_z(t)$ there has been a net displacement $\delta x$ to the right. The domain at measurement time 4 has the following parameters:
$r_4 = 3$ microns
$x_4 = 0.38$ microns
$\theta_4 = 0°$
Thus, at time 4, the domain is identical to the domain at time 0, except that it has automoted to the right a distance $x_4$.

Laboratory Measurements

Automotion of several types of bubble domains has been achieved in the laboratory using the principles stated. As an example, a magnetic bubble domain film of composition $Gd_1Y_1Tm_1Fe_{4.2}Ga_{0.8}O_{12}$ has been used to automote $\alpha_{30}$ bubbles. For this film, $\alpha = 0.045$, $\delta = 0.07$ microns, $h_z = 0.4$ Oe, $dH_z/dr = 5.7$ Oe/microns, $Q = 8$, $H_{ip} = 12$ Oe, and $h_a = -4$ Oe. The sample was mounted bubble film side down on a glass slide on top of which were two parallel thin film stripe conductors, in the manner shown in FIG. 12. A flat coil mounted under the glass slide was used to generate bias field modulation pulses $h_z(t)$ of up to 70 Oe with rise and fall times of 15 ns and minimum pulse duration of 50 ns. A steady in-plane field of up to 100 Oe could be applied parallel to the stripe conductors. Bubbles were nucleated by saturating the film and subsequently reducing the bias field $H_b$ to a value at which bubbles are stable while applying negative bias field pulses $h_z(t)$ of typically 10–20 Oe and 10 microsecond duration.

When the in-plane field $H_{ip}$ was set equal to 12 Oe, a train of bias field pulses of typical amplitude $h_a = -6$ Oe, pulse width 1 microsecond, and repetition rate 100 sec$^{-1}$, caused the bubbles to move. Equal numbers of bubbles moved close to the directions $\pm \vec{H}_{ip} \times \vec{H}_b$ with small angle deviations consistent with $s = 0$ winding number. These states have the structures $\delta_\pm$. Occasionally bubbles moved at angles near $\pm 45°$ and $\pm 135°$ from $H_{ip}$. These are the $\phi_i$ ($i = 1, 2, 3, 4$) states. Some bubbles, called inert bubbles, only jiggle randomly over distances less than 1 micron during pulse trains of several seconds duration.

Another type of automotion, parallel or anti-parallel to $H_{ip}$, is observed at higher $H_{ip}$ (greater than 50 Oe), greater pulse sizes (greater than 20 Oe), and smaller pulse widths (less than 100 ns). These are the $\pi$ state bubbles $\pi_\pm$. The direction of automotion did not depend on the sign of the bias field pulse in any example, but the velocity is greater for $h_a < 0$. Sinusoidal excitation can also be used in place of the pulse modulation. A particularly suitable frequency of sinusoidal excitation is that which matches the resonant frequency of the domain.

The bubble domains which have been automoted were tested in pulsed fields having spatial gradients to check their winding numbers. The $\sigma$ bubbles satisfied $s = 0.93 \pm 0.10$, while the $\phi$ state bubbles had winding number $s \simeq \frac{1}{2}$ and the $\pi$ state bubbles had winding number $s \simeq \frac{1}{2}$. The value of s for $\sigma$ bubbles is very stable if instantaneous velocities are held below saturation. Inert bubbles usually have a winding number $s = 1$ or $s = 0$, but occasionally a winding number greater than or equal to 2.

Figure 11A:
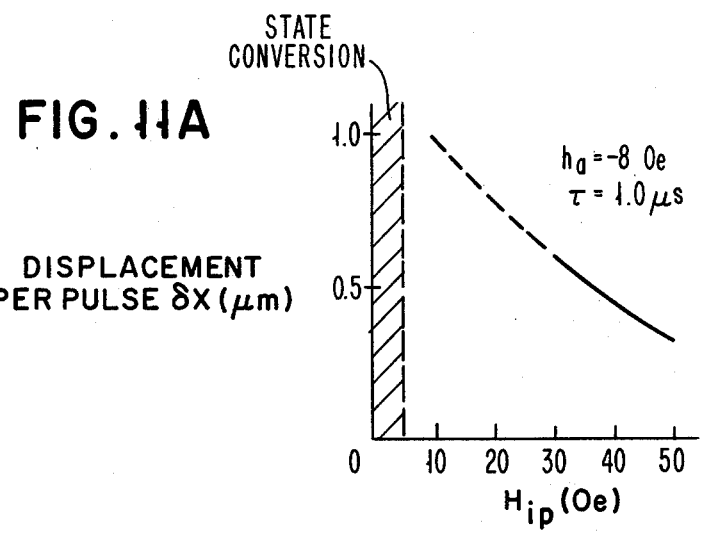
FIGS. 11A, 11B and 11C illustrates the displacement per pulse of the bubble domain during automotion for various conditions of applied magnetic fields. In particular.
Figure 11B:
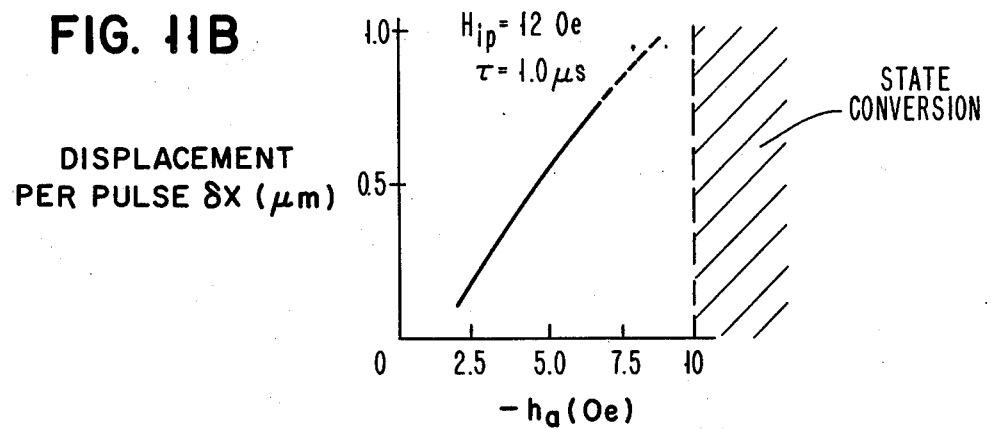
Figure 11C:
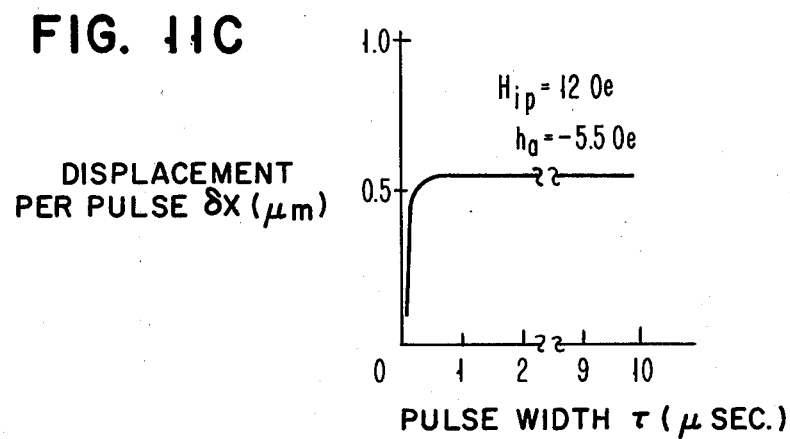

FIGS. 11A, 11B, and 11C show representative curves for automotion displacement per pulse $\delta x$ versus in-plane field pulse amplitude $h_a$ and pulse width $\tau$, respectively, for automotion using this bubble domain film. There is a close agreement between the experimental data and the theory described previously for the $\sigma$ state bubbles. Moreover, the conditions for observed conversion to non-automoting states, at sufficiently small $H_{ip}$ (FIG. 11A) and $h_a$ (FIG. 11B), correspond roughly to those for which the maximum excursion of calculated data approaches $\pm\pi/2$.

Observed bubble displacement during sudden reversal of $H_{ip}$ (with $h_z=0$) also supports the identification of $\sigma$ states. The north and south VBL's may simply traverse opposite sides of the bubble to interchange their positions without a state change, causing the bubble to jump once in the previous automotion direction. Dynamic properties similar to those of $\sigma$ state bubbles are expected if the single vertical Bloch lines of these bubbles are replaced by clusters of an odd number of vertical Bloch lines.

In FIG. 11A, state conversion occurs when the magnitude of the in-plane field becomes very small. This means that the gyrotropic forces on the Bloch lines will cause them to come together and annihilate since there will be an insufficient restoring force to prevent such annihilation.

On the other hand, in FIG. 11B, state conversions can occur as the magnitude $h_a$ of the pulse increases while holding the in-plane field at a constant magnitude. This simply means that the gyrotropic forces $F_g$ moving the Bloch lines will be sufficiently great that the restoring force is overcome. Thus, vertical Bloch lines will be driven into one another causing unwinding and state conversion.

In FIG. 11C, the displacement per pulse $\delta x$ is plotted against the pulse width $\tau$ of the bias modulation pulses. The magnitude of the in-plane field is constant and the magnitude $h_a$ of the bias pulse is as indicated. Once the pulse is applied, the displacement per pulse does not change dependent upon the pulse width.

Automotion of $\sigma$ type bubbles was also achieved in garnet compositions $Y_{1.92}Sm_{0.1}Ca_{0.98}Fe_{4.02}Ge_{0.98}O_2$ and $Y_{2.35}Eu_{0.65}Fe_{3.8}Ga_{1.2}O_{12}$ with maximum displacements of 0.5 and 0.85 microns per pulse, respectively. Additionally, coherent linear automotion orthogonal to $H_{ip}$ has been observed in a bubble lattice, at higher pulse amplitudes $h_a$.

Apparatus for Automotion (FIGS. 12–16)

Figure 12:
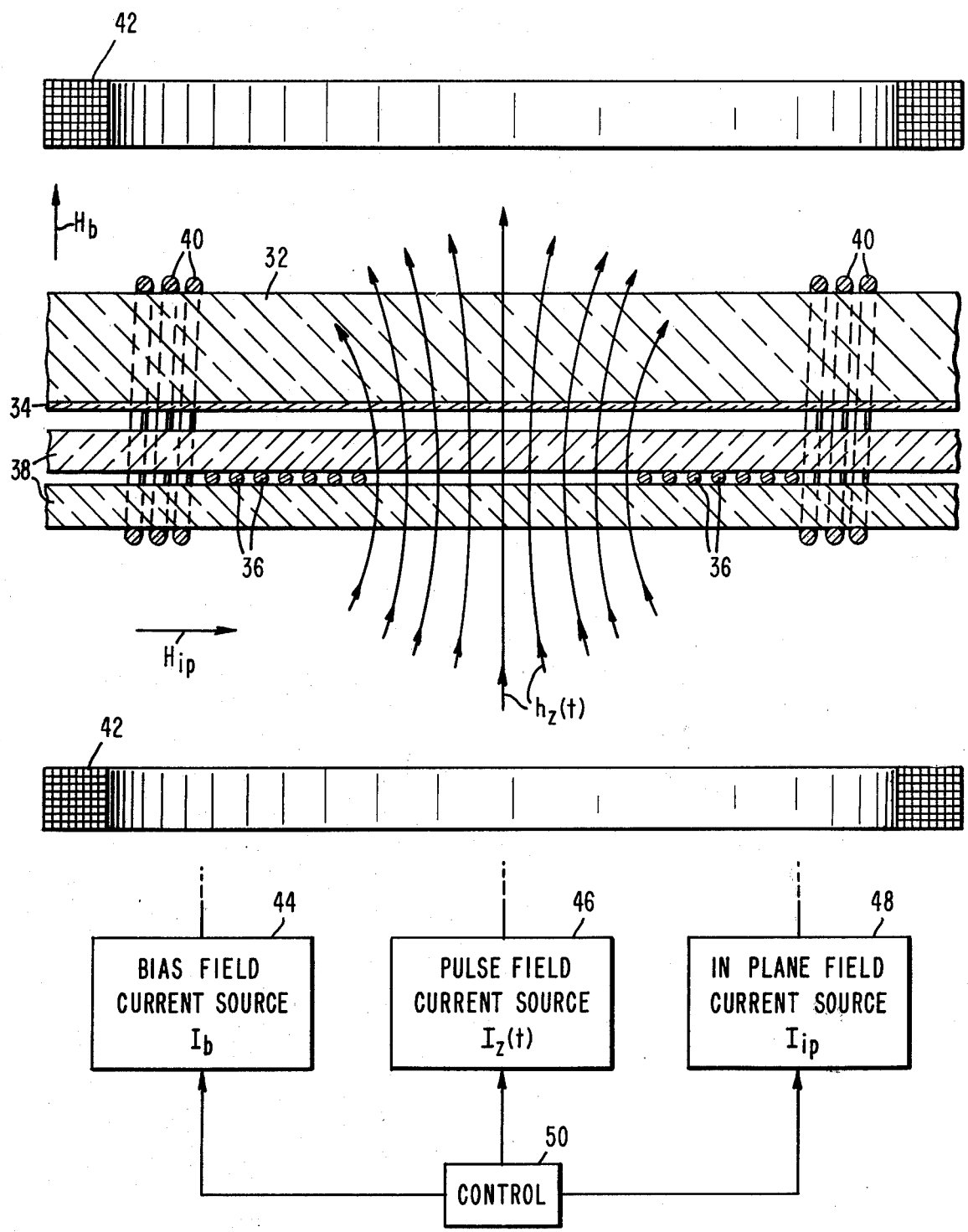
FIG. 12 illustrates an apparatus which is used to generate bubble domains for automotion, and for providing magnetic fields used to automote these bubbles.

FIG. 12 shows an apparatus for producing bubble domains capable of automotion and for automoting these domains. A substrate 32 has a bubble domain film 34 thereon. Substrate 32 is typically a garnet substrate, such as $Gd_3Ga_5O_{12}$, while the bubble film 34 can be, for instance, one of the garnet compositions previously mentioned. Other bubble domain materials, such as amorphous magnetic materials, can also be used with suitable substrates.

A helical pancake coil 36 is located between two glass plates 38 so that it can be brought close to the bubble domain film surface. Coil 36 is used to provide the field $h_z(t)$. The field lines produced by coil 36 are indicated in the drawing.

The current carrying coil 40 surrounding the bubble film 34 is used to provide the in-plane magnetic field $H_{ip}$, while the coil 42 is used to provide the static bias field $H_b$. Coil 40 can have x and y portions for providing the field $H_{ip}$ in any direction in the plane of medium 34.

Current $I_b$ from bias field current source 44 flows through bias coil 42 to produce field $H_b$. Current $I_z(t)$ is produced by pulse field current source 46, and flows through helical coil 36 to produce the field $h_z(t)$. Current $I_{ip}$ from in-plane field source 48 flows through coil 40 to produce the in-plane field $H_{ip}$. The current sources 44, 46, and 48 operate under control of control circuit 50. Control 50 provides the timing pulses to each of the current sources to produce magnetic fields $H_b$, $h_z(t)$, and $H_{ip}$ of any desired amplitudes, directions, etc. These current sources are well known circuits, as is the control unit 50.

As explained in the section describing laboratory experiments, this apparatus can be used not only to generate bubbles capable of automotion, but also to automote these bubbles. Still further, the addition of bubble domain sensing elements, such as magnetoresistive sensing elements (U.S. Pat. No. 3,691,540), can be provided to detect the various bubble states after discrimination in accordance with their velocity signatures.

FIG. 13

This figure shows a structure for generating and collecting bubble domains which move by automotion. In particular, the apparatus can be used to collect $\sigma_\pm$, $\pi_\pm$, and $\phi_\pm$ bubbles.

The basic apparatus is the same as that shown in FIG. 12, with the addition of a nucleating coil 51 and channels 52 for guiding bubble domain movement. Channels 52 can be, for instance, etched grooves in the magnetic medium which restrict the movement of magnetic bubble domains or can be a raised portin (dam) of the magnetic medium which provides an attractive location for the bubble domains. (As an example of the use of dams in a lattice, see U.S. Pat. No. 3,930,244.) The funnel shaped region used to guide $\sigma_+$ bubbles from the center of nucleating coil 51 can be defined by two grooves between which the $\sigma_+$ bubbles move, or the funnel shaped region can be a raised (thicker) portion of the magnetic material in which the bubbles exist.

Figure 13:
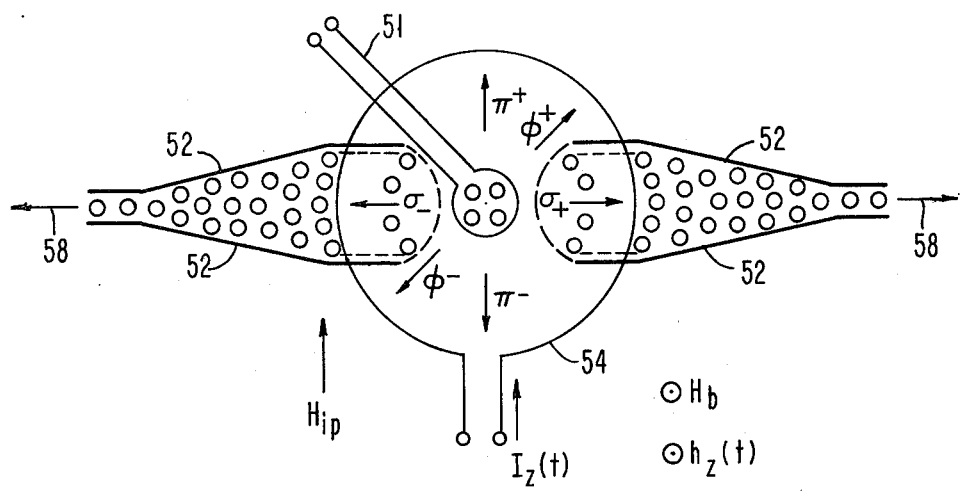
FIG. 13 shows structure which can be used to generate and collect magnetic bubble domains that can be moved by automotion.
Figure 15:
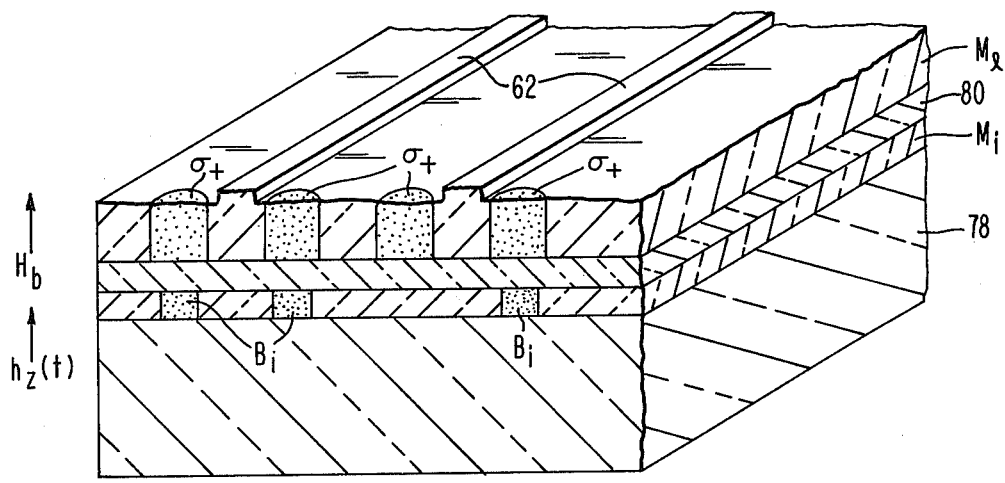
FIG. 15 is a side view of a double layer magnetic bubble film illustrating a suitable coding that can be used with the apparatus of FIG. 14 to provide an information handling system.

For reasons of simplicity, the current sources shown in FIG. 12 are omitted from FIG. 13. Current in coil 54 is used to produce the time varying bias field $h_z(t)$ while the in-plane field $H_{ip}$ is produced by the technique described with respect to FIG. 12. In accordance with the principles of automotion, the various bubble domains produced within the center of coil 51 are moved in the directions indicated in FIGS. 8A–8C when the fields $H_{ip}$ and $h_z(t)$ are in the directions indicated. Thus, the domains will separate from one another and can be individually collected. In this FIG., the collectors comprise the guide channels 52 and only two of these are shown. If desired, collectors can be provided for collecting the $\pi$ and $\phi$ bubbles in the same manner.

In the presence of the automotion magnetic fields, the $\sigma_-$ bubbles will move to the left and the $\sigma_+$ bubbles will move to the right. They will enter the guide structures 52 and will move in $\mp$ directions as indicated by the arrows 58. Continual movement of the bubble domains along the guide structures can be easily implemented by continued application of the automotion fields or by using pulsed conductors, and in particular by using the bubble pump structure described in detail in U.S. Pat. No. 3,913,079.

FIG. 14

This figure shows a structure for utilizing a lattice of bubbles which automote, such as a lattice of $\sigma_+$ bubbles or a lattice of $\sigma_-$ bubbles. Using automotion, the bubbles in the lattice can be made to move either left or right depending upon the type of bubble chosen and the direction of $H_{ip}$. Thus, with the field directions indicated in FIG. 14A, $\sigma_+$ bubbles will automote in the directions indicated. Lattice translation along a horizontal direction ($\pm x$) can be obtained, as well as automotion of a column of bubbles along a direction at an angle of 60° to the horizontal direction.

Figure 14:
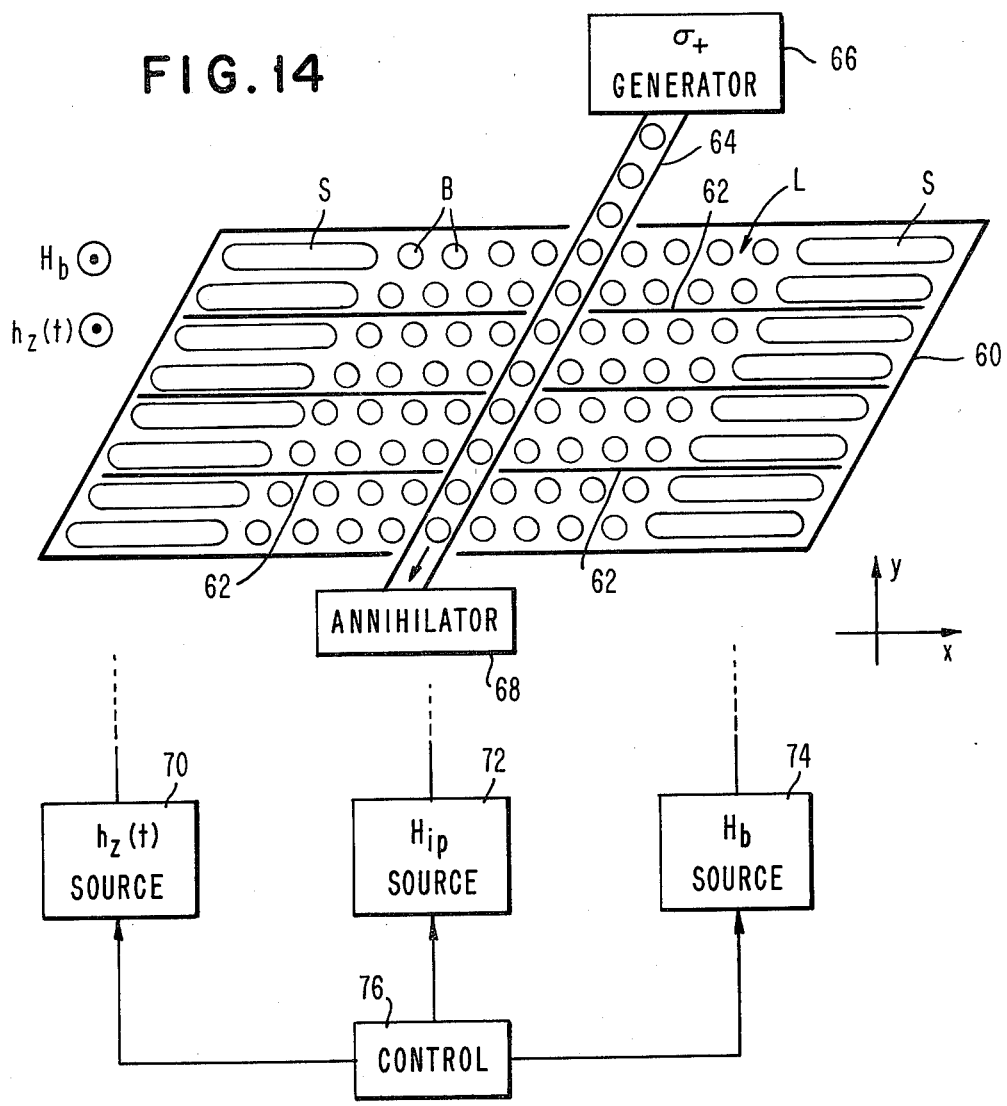
FIG. 14 illustrates a lattice of bubble domains in which movement of domains in the lattice in a plurality of directions is accomplished by bubble domain automotion.

In more detail, FIG. 14 shows a lattice L of magnetic bubble domains B surrounded by buffer regions of stripe domains S. The entire lattice is enclosed within guide rails 60, and some guide rails 62 are located between rows of bubble domains and stripes in the lattice. This type of structure is known in the art and in particular is shown in aforementioned U.S. Pat. No. 3,930,244. The guide structure 64 is in a direction transverse to the horizontal direction and extends from the $\sigma_+$ generator 66 to the annihilator 68.

In accordance with FIG. 12, sources 70, 72, and 74 are used to provide the current varying bias field $h_z(t)$, in-plane field $H_{ip}$, and static bias field $H_b$, respectively. A control means 76 is used to synchronize the operation of these various magnetic field sources.

Figure 14A:
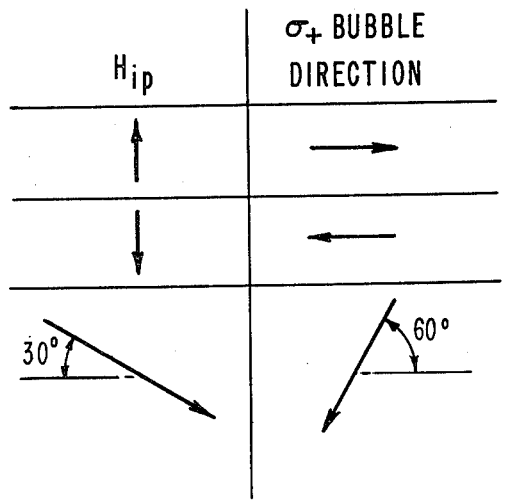
FIG. 14A is a table showing the directions of movement of $\sigma_+$ domains for various directions of in-plane field $H_{ip}$.

In operation, domains B in the lattice can be moved to the left or right by application of appropriate automotion fields. These fields are indicated in FIG. 14A. Thus, for a time varying bias field in the direction indicated, an in-plane field directed in the $+y$ direction will move $\sigma_+$ bubbles to the right, while an in-plane field directed in the $-y$ direction will automote the $\sigma_+$ bubbles to the left. When this right-left motion is occurring, the stripe domains S in the buffer regions are changed in length. For instance, if domain motion is to the right, the stripe domains on the right-hand side of the lattice shrink in length due to the pressure of the $\sigma_+$ bubbles moving toward them, while the stripe domains in the left-hand buffer elongate due to the reduced pressure on them. Since the force due to automotion is a small force, guide rail 60 will prevent the stripe domains from moving across the magnetic barrier presented by guide rail 60. Guide 64 is preferably comprised of two conductors as shown in aforementioned U.S. Pat. No. 3,930,244. With no currents in these conductors, automotion can be used to move a lattice of bubbles B back and forth across the guide 64. As an alternative, the guides 64 can be spaced sufficiently far from the bubble material that automotion forces will move bubbles past them. Also, interactions between the domains B and the stripes S will not push bubble domains out of their properly aligned rows due to the presence of the guide rails (dams) 62. Controlled automotion of the lattice in the $\pm x$ direction in this manner will bring a preferred column of bubble domains to the interior of transverse guide channel 64 where they can be removed from the lattice.

Removal of a column of bubble domains from the lattice along guide 64 occurs by changing the direction of the in-plane field. As shown in FIG. 14A, when $H_{ip}$ is directed downwardly from the horizontal direction at a 30° angle, automotion of bubbles will proceed along 60° columns. This motion will occur only in guide channel 64 where segments of guide rail 62 are missing. In this manner, only the column present within channel 64 is removed to the annihilator 68. Further $\sigma_+$ bubbles are moved from generator 66, via automotion, to replace those removed from the lattice. As noted, this generator can be the same as that described previously.

Thus, a lattice is provided in which translation and removal of selected columns occurs due to the presence of automotion fields only. No active structure, such as bubble pumps or magnetic overlays, is needed for actively interacting with the bubbles to either translate them or remove them from the lattice.

FIG. 15

This figure shows the type of coding which can be utilized to provide an information system using a lattice of bubble domains which can be moved by automotion. It comprises a double layer structure in which one bubble domain medium $M_l$ contains the $\sigma_+$ bubbles used in the lattice, while another bubble domain medium $M_i$ located on substrate 78 contains the information bubble domains $B_i$. Domains $B_i$ are domains which do not move, or move less efficiently than the $\sigma_+$ domains when the automotion fields used to move the lattice domains are applied. For example, domains $B_i$ can be sufficiently smaller than the $\sigma_+$ domains that the automotion force on them is very small. Each $\sigma_+$ domain is effectively attached by magnetostatic coupling to at least one domain $B_i$ in layer $M_i$. A non-magnetic layer 80 is located between layers $M_l$ and $M_i$. Movement of information domains $B_i$ is accomplished by moving the lattice of $\sigma_+$ domains using automotion fields. The $\sigma_+$ domains and the coupled information domains $B_i$ can exist within a common range of bias field $H_b$.

Information handling systems using a lattice of domains with this type of coding are shown in more detail in copending applications Ser. No. 449,308, filed Mar. 8, 1974 (now U.S. Pat. No. 3,996,571), and Ser No. 537,789, filed Dec. 31, 1974 (now U.S. Pat. No. 4,052,711), both of which are assigned to the present assignee. In addition, reference is made to an article by Y. S. Lin and P. J. Grundy, entitled "Bubble Domains in Double Garnet Films" which appeared in the Journal of Applied Physics, Vol. 45, No. 9, Sept. 1974, at pp. 4084–4094. This article describes a structure suitable for the magnetic bubble layers shown in FIG. 15, and further describes the coupling between domains in the two magnetic layers.

Because these references describe information handling systems using double layers, one of which contains a lattice, extensive detail will not be presented here. Instead, it is sufficient to note that the structure of FIG. 14 is used to move the $\sigma_+$ bubbles in the lattice, and that such movement will move the magnetostatically coupled information bubbles $B_i$. These information bubbles are coded in terms of the usual presence/absence of domains and can therefore be detected by conventional bubble sensing techniques. Thus, an information handling system using a lattice of bubble domains capable of automotion is provided.

FIG. 16

Figure 16:
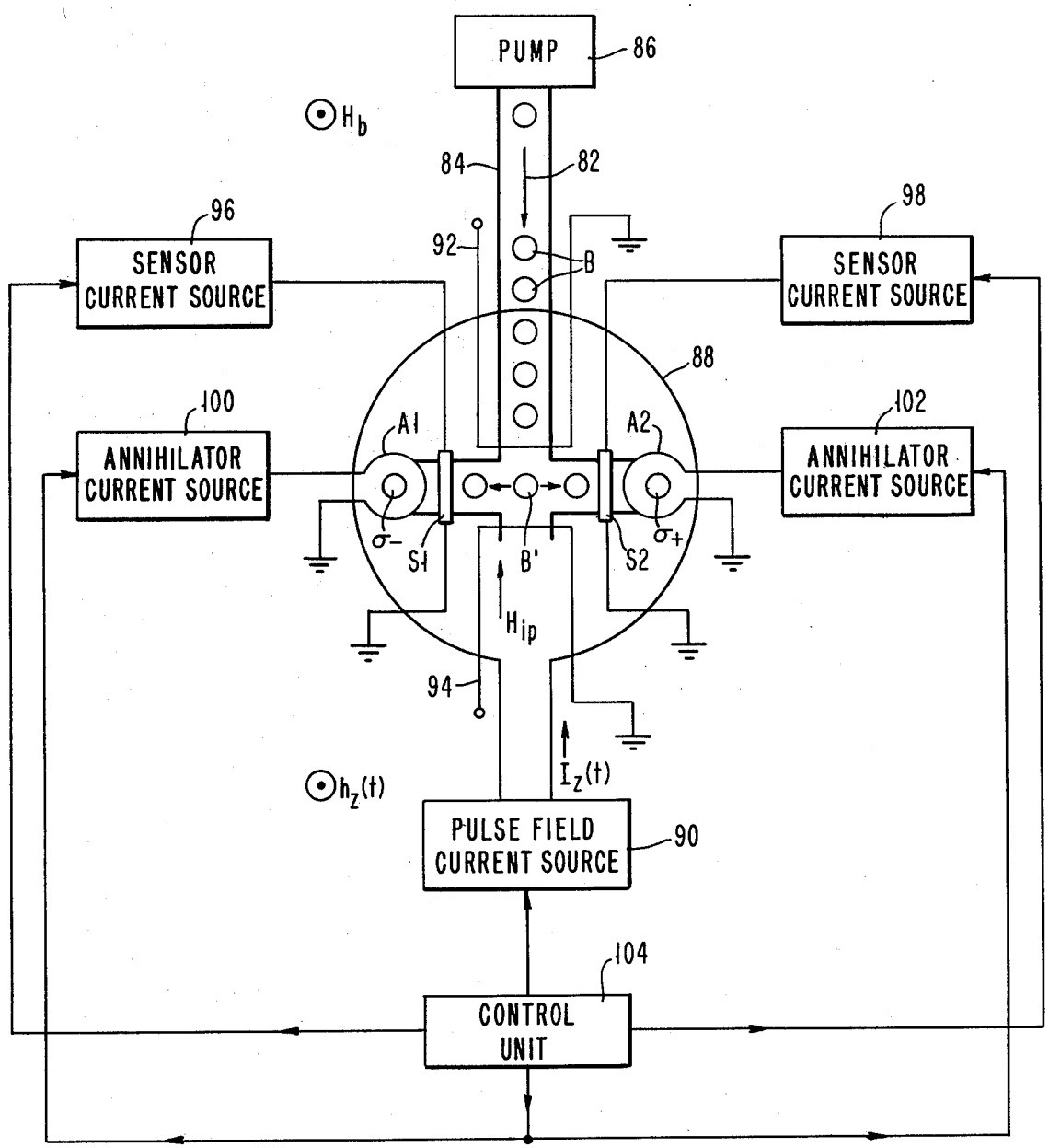
FIG. 16 shows an apparatus which can be used to detect magnetic bubble domains, using the principle of automotion.

FIG. 16 shows a structure for detection of bubble domains having the same or different winding numbers s using the principles of automotion. In particular, this structure is designed to detect $\sigma_+$ and $\sigma_-$ bubbles. However, it will be apparent to those skilled in the art that the principles described herein can be applied for detection of other bubble domains which automote, such as $\pi$ and $\phi$ bubbles. Since the various bubbles which automote will move in different directions when subjected to the same magnetic fields, all that is required is that a sensor be placed in the path of movement of these bubbles. Since it is known what directions the bubbles will move in for a particular set of applied fields, the indications of the properly located sensors will tell the presence and absence of these domains.

In more detail, FIg. 16 shows a train of bubbles B moving in the direction of arrow 82 along the guide structure 84. This motion can be produced by a bubble domain pump 86 such as that described in U.S. Pat. No. 3,913,079. This guide structure can be defined by etched grooves in the magnetic material or by a raised portion of the magnetic material as was noted earlier. Additionally, ion implantation or magnetic materials can be used to define the guide structures in accordance with known principles.

A coil 88 connected to a pulse field current source 90, is used to provide the pulse modulated field $h_z(t)$. A source, not shown, provides the stabilizing bias field $H_b$. A further source, also not shown, is used to provide the in-plane field $H_{ip}$. The sources used to provide $H_b$ and $H_{ip}$ are the same as those described previously and are not repeated here for reasons of simplicity.

A gate, comprising conductors 92 and 94, is used to position one domain at a time at the center of coil 88. With no current in conductor 92, and a current toward the left in conductor 94, a domain B' will move to a position between these conductors. Oppositely directed currents in conductors 92 and 94 will hold B' at this position. Reversing the current in conductor 94 and turning off the current in conductor 92 will cause a non-automoting bubble to move downwardly where it can be detected by another sensor (not shown).

When the domain B' is at the center of coil 88, the guide structure provides alternate paths for its movement. Thus, if the automotion fields $H_{ip}$ and $h_z(t)$ are applied, the $\sigma_+$ bubbles will move to the right while the $\sigma_-$ bubbles will move to the left. Sensor 31 is provided for detection of the $\sigma_{31}$ bubbles while sensor S2 is provided for detection of the $\sigma_+$ bubbles. These sensors can be any sensors used for detection of the presence of a bubble domain, and are typically magnetoresistive sensors as are described in more detail in U.S. Pat. No. 3,691,540. Sensor current source 96 provides sensing current through S1 while sensor current source 98 provides sensing current through S2. In a known manner, voltage changes are produced across the sensors S1 and S2 when domains are magnetically coupled to the sensors. These voltage changes are detected in the usual manner and can be used to represent information.

After being sensed by sensors S1 and S2, the domains continue to automote until they are within annihilators A1 and A2. These annihilators comprise current carrying coils connected to the annihilator current sources 100 and 102, respectively. Thus, currents in A1 and A2 are used to create magnetic fields to collapse domains located therein. Domain $\sigma_-$ is shown within annihilator A1 while domain $\sigma_+$ is shown within annihilator A2.

A control unit 104 is used to provide synchronization pulses for operation of the sensor current sources 96 and 98 and the annihilator current sources 100 and 102. Also, the control unit provides pulses for triggering the operation of the pulse field current source 90.

In the operation of FIG. 16, domains which have been sensed can be utilized elsewhere in an information handling system, rather than being destroyed. To do so, the domains would be moved back to the storage unit by appropriate propagation means (such as bubble pumps and guiding structures) or by automotion fields and appropriate guiding structures. Additionally, the apparatus of FIG. 16 can be extended to provide detection of $\pi$ and $\phi$ state bubbles, merely by providing additional sensors. The initial train of domains B would be brought to the center of coil 88 along an angle other than 90° so that the $\pi_+$ and $\pi_-$ domains could be collected (see FIG. 13).

SUMMARY

What has been shown is a technique for generation, propagation, and detection of domains using the principles of automotion. This type of bubble domain movement is useful for providing information handling systems where domains are moved by time varying uniform fields rather than by fields having spatial gradients. Thus, automotion does not rely on the provision of spatial gradients of sufficient magnitude to move the domains but rather utilizes the dynamics of wall magnetization movement in order to displace domains.

In general, a time varying magnetic field is used in combination with other means which will restore an altered wall magnetization distribution toward its original distribution in order to provide continual movement when automotion fields are applied to the bubble. Thus, any type of means can be used to provide the restoring force, including magnetic fields and physical properties within the magnetic material. Also, depending upon the wall magnetization distribution of the bubble domains, different types of time varying magnetic fields can be utilized.

Another form of nonlinearity capable of imparting automation is something called the "breaststroke effect". To illustrate this effect assume that, in some bubble state, both the radius and the center of the bubble oscillate sinusoidally at the same frequency in response to two applied fields. Also assume that the phase angle between these oscillations is such that the radius has its maximum value at the same time that the velocity of the center has its negative maximum. Since the drag force due to viscous damping or any other dissipative mechanism is proportional to the radius, the drag has a greater effect while the velocity is negative. When this drag force is averaged over one cycle of the motion the result is a small positive average thrust imparting a small positive average velocity to the bubble. The breaststroke effect makes a negligibly small contribution to the velocity of $\sigma$ automotion described here but may be significant in other cases.

What is claimed is:

1. An apparatus for moving magnetic bubble domains having Bloch lines therein in a magnetic medium in the absence of active magnetic or conductor propagation elements, including:
   means for applying a magnetic field in the plane of said medium,
   means for applying a time varying magnetic field characterized by the absence of spatial gradients, said time varying magnetic field having a sufficient magnitude and sufficiently fast rise time or fall time to move said bubbles in said magnetic medium.

2. The apparatus of claim 1, where said time varying magnetic field is in a direction normal to the plane of said magnetic medium.

3. The apparatus of claim 2, including means for changing the magnitude of the magnetic field in the plane of said medium.

4. The apparatus of claim 1, where said time varying magnetic field is a pulse field.

5. The apparatus of claim 1, where said time varying magnetic field is a sinusoidal field.

6. The apparatus of claim 1, where said bubble domains are characterized by the presence of separated clusters of winding wall transitions each of which includes at least one vertical Bloch line.

7. The apparatus of claim 1, where said bubble domains are characterized by the presence of horizontal Bloch lines in their wall magnetization.

8. The apparatus of claim 1, including further means for changing the direction of said magnetic field in the plane of said medium.

9. An apparatus for displacing the center of a magnetic bubble domain a distance x, comprising:
   means for causing precession of the wall moment magnetization vectors of said buble domain to change the magnetization vector distribution along the wall of said domain, said precession producing a reaction force tending to move said bubble the distance x, where said means includes means for applying to said bubble domain a time varying magnetic field having substantially no spatial gradients,
   magnetic field means for restoring the magnetization vector distribution along the wall of said bubble domain toward its original relative distribution prior to said precession.

10. The apparatus of claim 9, where said means for causing said precession includes means for changing the radius of said bubble domain.

11. The apparatus of claim 10, where the rate of precession of wall moment vectors is greater than the rate of radius change of the bubble domain.

12. The apparatus of claim 11, where the rate of change of the radius of the bubble domain is greater than the rate of change of the displacement x with time.

13. The apparatus of claim 9, where the bubble domain has separated clusters containing at least one vertical Bloch line in each cluster, where said vertical Bloch lines precess along the wall of the domain.

14. The apparatus of claim 9, where said means for causing precession includes means for producing a time varying magnetic field that acts on the wall moment magnetization vectors of said bubble.

15. The apparatus of claim 14, where said means for restoring includes means for providing a magnetic field substantially in the plane of said magnetic medium.

16. The apparatus of claim 14, where said means for restoring includes crystallographic misalignment in said magnetic medium.

17. The apparatus of claim 9, where the non-linearity of domain wall motion diminishes the displacement of the domain during the time the magnetization distribution along the wall of the bubble domain is restored toward its original relative distribution.

18. A method for moving a magnetic bubble domain in a magnetic medium without the need for magnetic coupling between said domain and magnetic propagation elements, comprising:
   applying a spatially uniform external magnetic field whose amplitude changes with time to said bubble domain, and
   applying a magnetic field in the plane of said magnetic medium along a first direction.

19. The method of claim 18, where said time varying magnetic field is oriented along the direction of magnetization of said bubble domain and said in-plane magnetic field has a constant amplitude.

20. The method of claim 19, where the orientation of said in-plane magnetic field is changed to a second direction.

21. The method of claim 19, where said time varying magnetic field is a pulse field.

22. The method of claim 19, where said time varying magnetic field is a sinusoidal field.

23. The method of claim 18, where said magnetic bubble domain includes separated clusters of vertical Bloch lines, each of said clusters having at least one vertical Bloch line therein.

24. The method of claim 18, where said magnetic bubble domain has at least one horizontal Bloch line therein.

25. An apparatus for displacing the center of a bubble domain by a distance x without using magnetic fields having spatial gradients, said bubble domains being characterized by domain walls having wall magnetization vectors therein, comprising:
   means for precessing said wall magnetization vectors with a velocity $V = rd\theta/dt$, where r is the bubble domain radius and $\theta$ is the angular displacement of said wall magnetization vectors,
   means to change the radius of said bubble domain at a rate dr/dt, where $|dr/dt| > |dx/dt|$, while $dr/dt > 0$, and $|dr/dt| < |dx/dt|$ while $dx/dt < 0$,
   means to precess said wall magnetization vectors in a direction reverse to their original direction of precession.

26. The apparatus of claim 25, where said bubble domain contains separate clusters of vertical Bloch lines, there being at least one vertical Bloch line in each cluster.

27. The apparatus of claim 25, where said means to process includes means for producing a time varying magnetic field substantially free of spatial gradients.

28. The apparatus of claim 27, where said means for precessing wall moments in a reverse direction includes means for producing a magnetic field.

29. An apparatus for manipulating magnetic bubble domains in a magnetic medium comprising:
   means for generating magnetic bubble domains having Bloch lines therein,
   means for displacing the center of these bubble domains in the absence of magnetic fields having spatial gradients and in the absence of propagation elements to which said domains are magnetically coupled during propagation, said means for displacing including means for producing a spatially uniform time varying magnetic field having a sufficiently fast rise or fall time to cause precession of said Bloch lines in said bubble domains,
   means for producing a magnetic field in the plane of said magnetic medium,
   means for detecting magnetic domains.

30. The apparatus of claim 29, where said bubble domains are arranged in a lattice of such domains, the positions of said domains in said lattice being sufficiently close to one another that interactions exist between said bubble domains in said lattice.

31. The apparatus of claim 30, wherein said bubble domain lattice has an enclosed plurality of bubble domains in rows and columns, there being a column of stripe domains established on each end of the lattice, one pair of stripe domains for each row of bubble domains in the lattice.

32. A magnetic bubble domain apparatus including:

a magnetic bubble domain lattice comprised of a plurality of bubble domains in rows and columns, said bubble domains being capable of movement in said magnetic medium when spatially uniform, time varying magnetic fields are applied to said bubble domains, a column of stripe domains established on each end of the lattice, one pair of stripe domains for each row of bubble domains in the lattice, and adjusting means for expanding and contracting, at opposite ends of each row, the length of each pair of said strip e domains in accordance with the required propagation direction of each row of bubble domains, said adjusting means including means for applying a spatially uniform, time varying magnetic field to said domains in said lattice, said field having a sufficiently fast rise or fall time to cause precession of the wall moment magnetization vectors in said domains for movement of domains in said lattice.

33. The apparatus of claim 32, including means for removing bubble domains from said lattice using a spatially uniform, time varying magnetic field.

34. The apparatus of claim 33, where said bubble domains are removed from said lattice in a direction transverse to the direction of expansion and contraction of said stripe domains.

35. A magnetic bubble domain apparatus, comprising:
means for oscillating the center position of said bubble domain, said means for oscillation including means for applying a spatially uniform, time varying magnetic field to said bubble domain, and means for preferentially diminishing said domain center oscillation in a desired direction, where said time varying magnetic field oscillates said bubble domain radius, and said means for preferentially diminishing domain center oscillation diminishes said oscillation during the phase of domain radius change when the radius varies more slowly.

36. A bubble domain apparatus, comprising:
a magnetic medium in which said bubble domain exists, said bubble domain having a wall moment magnetization configuration capable of being precessed along said wall to a different configuration, means for orienting Bloch lines in said wall magnetization at diametrically opposite positions in said wall, and means for applying repetitive pulses of a spatially uniform, time varying magnetic field to precess these Bloch lines along the periphery of said wall each of said pulses having sufficient magnitude and sufficiently fast rise or fall time to move said bubble domain in said magnetic medium.

37. A magnetic bubble domain apparatus comprising:
a magnetic bubble domain having a wall magnetization structure comprised of wall transitions, means for separating clusters of said wall transitions, magnetic field means for moving said separated clusters along the periphery of said wall, said magnetic field means producing time varying magnetic fields having substantially no spatial gradients across the diameter of said bubble domain, and means for restoring said moved clusters to their original separated locations along said wall.

38. A device for discriminating magnetic bubble domains in a magnetic medium, said domains having different wall magnetization configurations, comprising:
means for applying a magnetic field in the plane of said magnetic medium, means for applying a spatially uniform, time varying magnetic field to said bubble domains to produce domain motions in different directions in accordance with the different wall magnetization configurations of said domains to thereby discriminate said domains.

39. The device of claim 38, where said domains have the same winding number.

* * * * *